US012768910B2

(12) United States Patent
Hotta et al.

(10) Patent No.: US 12,768,910 B2
(45) Date of Patent: Oct. 20, 2026

(54) MEASUREMENT DEVICE

(71) Applicant: TDK CORPORATION, Tokyo (JP)

(72) Inventors: Yu Hotta, Tokyo (JP); Kensuke Sekihara, Hachioji (JP)

(73) Assignee: TDK CORPORATION, Tokyo (JP)

( * ) Notice: Subject to any disclaimer, the term of this patent is extended or adjusted under 35 U.S.C. 154(b) by 160 days.

(21) Appl. No.: 18/955,679

(22) Filed: Nov. 21, 2024

(65) Prior Publication Data

US 2025/0208235 A1 Jun. 26, 2025

(30) Foreign Application Priority Data

Dec. 20, 2023 (JP) ................................ 2023-214648

(51) Int. Cl.
*G01R 33/00* (2006.01)
*G01R 33/02* (2006.01)

(52) U.S. Cl.
CPC ......... *G01R 33/0029* (2013.01); *G01R 33/02* (2013.01)

(58) Field of Classification Search
CPC .... G01R 33/0029; G01R 33/02; G01D 21/00; G01D 3/0365; G01D 18/00; G01D 21/02
See application file for complete search history.

(56) References Cited

U.S. PATENT DOCUMENTS

2019/0107578 A1* 4/2019 Marinov Peev ....... G01D 18/00
2022/0341764 A1* 10/2022 Cunha ................ G01R 33/0029
2024/0118110 A1* 4/2024 Roos ................. G01R 33/0283

FOREIGN PATENT DOCUMENTS

JP 2020-139840 A 9/2020

* cited by examiner

*Primary Examiner* — Giovanni Astacio-Oquendo
(74) *Attorney, Agent, or Firm* — Oliff PLC

(57) ABSTRACT

A measurement device includes a signal sensor unit having one or more signal sensors configured to measure a measurement signal in which a target signal and noise are mixed, a reference sensor unit having two or more reference sensors configured to measure a reference signal including the noise, and a processing unit. The processing unit includes a reference sensor data group unit configured to classify reference sensor data that is data of two or more reference signals measured by the two or more reference sensors of the reference sensor unit into two groups, a first-order signal processing unit configured to perform a noise cancelation process for signal sensor data using reference sensor data of a first group, and a second-order signal processing unit configured to perform a noise cancelation process for first-order signal-processed data using reference sensor data of a second group.

7 Claims, 8 Drawing Sheets

MEASUREMENT DEVICE

CROSS-REFERENCE TO RELATED APPLICATION

Priority is claimed on Japanese Patent Application No. 2023-214648, filed on Dec. 20, 2023, the content of which is incorporated herein by reference.

BACKGROUND OF THE INVENTION

Field of the Invention

The present disclosure relates to a measurement device.

Description of Related Art

It is necessary to eliminate various types of environmental noise superimposed on a desired signal so that accurate analysis results are obtained in various measurement processes.

In general, a method of providing a reference sensor separately from a signal sensor for measuring a desired signal and filtering data acquired by the reference sensor in time series is used as an environmental noise cancelation method.

If there are many types of environmental noise, it is necessary to increase the number of reference sensors in correspondence with the many types of environmental noise.

A measurement device described in Patent Document 1 includes a plurality of measurement sensor units provided at measurement positions for measuring a measurement target and configured to detect an input magnetic field in at least one detection axis direction, a plurality of reference sensor units provided at reference positions away from the measurement positions and configured to detect input magnetic fields in three axis directions, and a correction unit configured to correct measurement signals corresponding to outputs of the plurality of measurement sensor units using reference signals indicating outputs of the plurality of reference sensor units (see Patent Document 1).

PATENT DOCUMENTS

[Patent Document 1] Japanese Unexamined Patent Application, First Publication No. 2020-139840

SUMMARY OF THE INVENTION

However, in the conventional technology, when a plurality of reference sensors are used, the accuracy of eliminating noise from a result of measuring the desired signal may be insufficient.

The present disclosure has been made in consideration of such circumstances and an objective of the present disclosure is to provide a measurement device capable of increasing the accuracy of eliminating noise from a result of measuring a desired signal using a plurality of reference sensors.

According to an aspect, there is provided a measurement device including: a signal sensor unit having one or more signal sensors configured to measure a measurement signal in which a target signal and noise are mixed; a reference sensor unit having Q or more reference sensors configured to measure a reference signal including the noise when Q is an integer of 2 or more; and a processing unit, wherein the processing unit includes a reference sensor data grouping unit configured to classify reference sensor data that is data of Q or more reference signals measured by the Q or more reference sensors of the reference sensor unit into first to $Q^{th}$ groups that is Q groups; and a $k^{th}$-order signal processing unit, where k is an integer of 1 or more and Q or less, wherein a first-order signal processing unit performs a noise cancelation process for signal sensor data that is data of the measurement signal measured by the signal sensor using the reference sensor data of the first group or performs a noise cancelation process for the signal sensor data that is the data of the measurement signal measured by the signal sensor and the reference sensor data of one or more groups other than the first group using the reference sensor data of the first group, wherein, when u is an integer of 2 or more and (Q−1) or less, a $u^{th}$-order signal processing unit performs a noise cancelation process for $(u-1)^{th}$-order signal-processed data after a noise cancelation process of a $(u-1)^{th}$-order signal processing unit for the signal sensor data using the reference sensor data of a $u^{th}$ group or signal-processed reference sensor data after noise cancelation processes of one or more of first- to $(u-1)^{th}$-order signal processing units for the reference sensor data of the $u^{th}$ group or performs a noise cancelation process for $(u-1)^{th}$-order signal-processed data after the noise cancelation process of the $(u-1)^{th}$-order signal processing unit for the signal sensor data and the reference sensor data of one or more groups other than the first to $u^{th}$ groups or signal-processed reference sensor data after noise cancelation processes of one or more of the first- to $(u-1)^{th}$-order signal processing units for the reference sensor data using the reference sensor data of the $u^{th}$ group or signal-processed reference sensor data after noise cancelation processes of one or more of the first- to $(u-1)^{th}$-order signal processing units for the reference sensor data of the $u^{th}$ group, and wherein a $Q^{th}$-order signal processing unit performs a noise cancelation process for $(Q-1)^{th}$-order signal-processed data after a noise cancelation process of a $(Q-1)^{th}$-order signal processing unit for the signal sensor data using the reference sensor data of the $Q^{th}$ group or signal-processed reference sensor data after noise cancelation processes of one or more of first- to $(Q-1)^{th}$-order signal processing units for the reference sensor data of the $Q^{th}$ group.

According to the present disclosure, a measurement device can increase the accuracy of eliminating noise from a result of measuring a desired signal using a plurality of reference sensors.

DETAILED DESCRIPTION OF THE INVENTION

Hereinafter, embodiments of the present disclosure will be described with reference to the drawings.

[Measurement Device]

Figure 1:
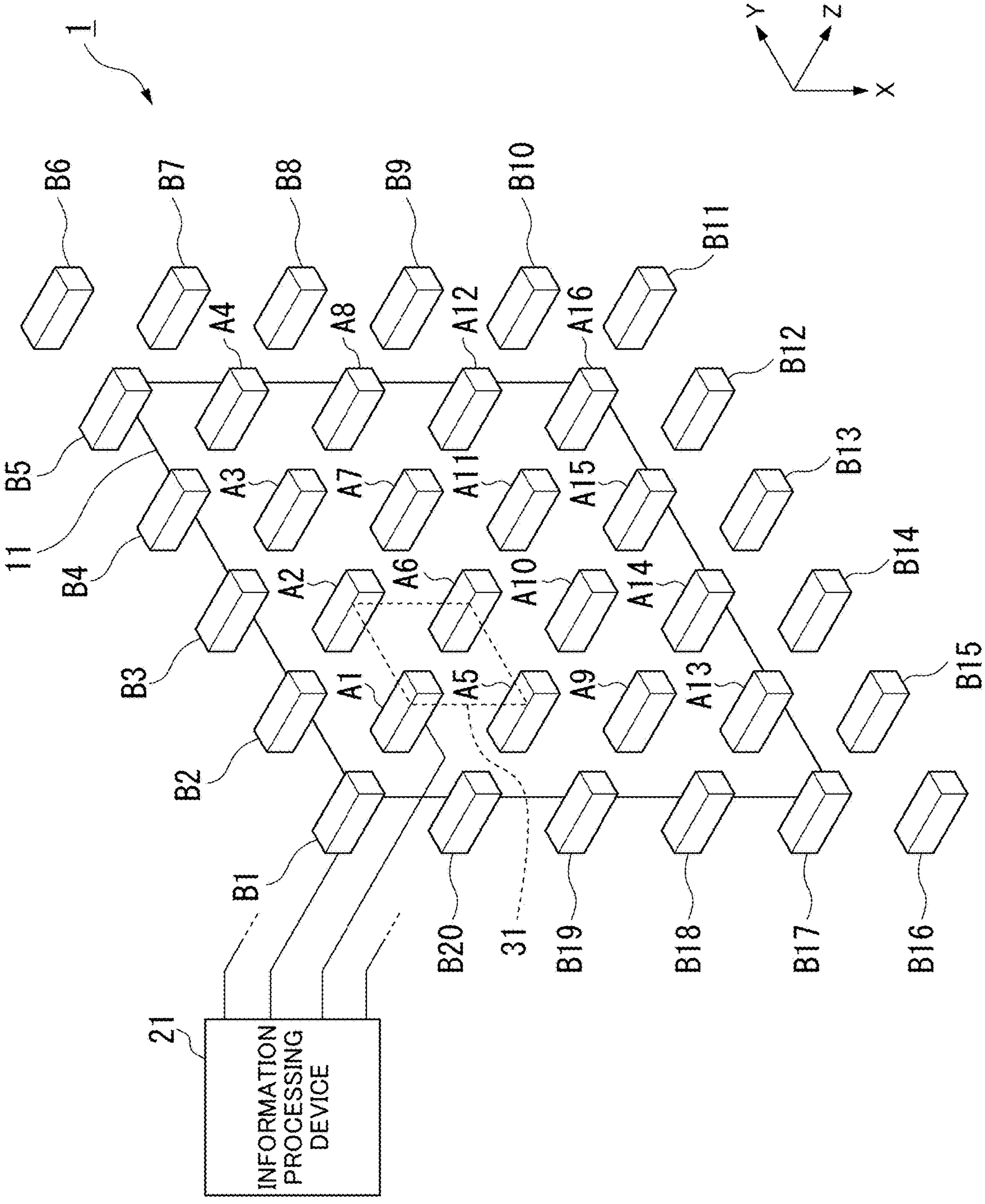
FIG. 1 is a diagram showing a schematic configuration of a measurement device including an information processing device according to an embodiment.

FIG. 1 is a diagram showing a schematic configuration of a measurement device 1 including an information processing device 21 according to the embodiment.

In FIG. 1, an XYZ Cartesian coordinate system, which is a three-dimensional Cartesian coordinate system, is shown for convenience of description.

The measurement device 1 includes L signal sensors A1 to AL that are two or more signal sensors, M reference sensors B1 to BM that are two or more reference sensors, and an information processing device 21.

In the example of FIG. 1, a region where the signal sensors A1 to AL are arranged is schematically shown as a signal sensor arrangement unit 11.

Here, in the present embodiment, a case where L=16 and M=20 will be described as an example.

In addition, the number of signal sensors A1 to AL may be any number of 1 or more. Although a case where the number of signal sensors A1 to AL is two or more is shown in the present embodiment, the number of signal sensors may be one.

Moreover, the number of reference sensors B1 to BM may be any number of 2 or more.

In FIG. 1, the measurement target 31 is also shown.

In addition, the measurement device may be referred to as, for example, a measuring system or the like. Moreover, measurement may be referred to as, for example, evaluation, detection, or the like.

When a plurality of signal sensors A1 to AL exist, for example, a device (for example, a signal sensor unit) integrally including the plurality of signal sensors A1 to AL may be configured.

Moreover, when a plurality of reference sensors B1 to BM exist, for example, a device (for example, a reference sensor unit) integrally including the plurality of reference sensors B1 to BM may be configured.

Moreover, a device (for example, a sensor unit) integrally including all of the signal sensors A1 to AL and the reference sensors B1 to BM may be configured.

<Arrangement of Signal Sensors>

In the example of FIG. 1, the signal sensor arrangement unit 11 is a square planar region parallel to an XY plane.

In the example of FIG. 1, 16 signal sensors A1 to A16 are arranged at equal intervals in a direction parallel to one side of the square (in a direction parallel to an X-axis) and at equal intervals in a direction perpendicular to the direction (a direction parallel to a Y-axis) inside the signal sensor arrangement unit 11.

Specifically, the four signal sensors A1 to A4 are arranged at equal intervals in a direction parallel to the Y-axis, the four signal sensors A5 to A8 are arranged at equal intervals in a direction parallel to the Y-axis, the four signal sensors A9 to A12 are arranged at equal intervals in a direction parallel to the Y-axis, and the four signal sensors A13 to A16 are arranged at equal intervals in a direction parallel to the Y-axis.

Moreover, the four signal sensors A1, A5, A9, and A13 are arranged at equal intervals in a direction parallel to the X-axis, the four signal sensors A2, A6, A10, and A14 are arranged at equal intervals in a direction parallel to the X-axis, the four signal sensors A3, A7, A11, and A15 are arranged at equal intervals in a direction parallel to the X-axis, and the four signal sensors A4, A8, A12, and A16 are arranged at equal intervals in a direction parallel to the X-axis.

In the example of FIG. 1, the equal interval in the direction parallel to the X-axis is the same as the equal interval in the direction parallel to the Y-axis. In the example of FIG. 1, the plurality of signal sensors A1 to AL are arranged in an array shape.

Here, an aspect of the arrangement (overall arrangement) of the signal sensors A1 to AL is not particularly limited and other aspects may be used.

Moreover, the arrangement (for example, a position and a direction) of the signal sensors A1 to AL is not particularly limited and various aspects may be used. For example, although an example in which the directions of the signal sensors A1 to AL are the same is shown in FIG. 1, the directions of the signal sensors A1 to AL may be arbitrary.

In addition, the names of the signal sensors are names for illustrative purposes and, for example, the signal sensors may be referred to by other names such as measurement sensors or (simply) sensors.

<Arrangement of Measurement Target>

In the example of FIG. 1, in the case of projection onto the XY plane in a state in which the deviation of the position parallel to a Z-axis is ignored, the measurement target 31 is arranged at the center (or near the center of the signal sensor arrangement unit 11).

Here, an aspect of an arrangement relationship between the measurement target 31 and the signal sensors A1 to AL is not particularly limited and other aspects may be used.

<Measurement Target>

The measurement target 31 is not particularly limited and various things may be used as the measurement target 31.

As an example, the measurement target 31 may be a coil that generates magnetism. In this case, when the magnetism generated from the coil is measured, the information processing device 21 can suppress an influence of environmental noise. As another example, a sound source that emits a sound (a sound signal) may be used as the measurement target 31.

<Target Signal>

A measurement (detection) target for the signal sensors A1 to AL is a desired signal due to the measurement target 31 (also referred to as a target signal for convenience of description). At this time, noise is superimposed on the target signal. For this reason, each of the signal sensors A1 to AL measures (detects) a signal in which the target signal and the noise are mixed (also referred to as a mixed signal for convenience of description). Also, each of the signal sensors A1 to AL obtains its measurement result (also referred to as a signal measurement result for convenience of description).

As the target signal, a signal of any physical quantity may be used. For example, signals of magnetism, an electric current, a voltage, a sound, light, and the like may be used.

The target signal may be referred to as, for example, a signal of interest or a desired signal.

<Arrangement of Reference Sensors>

In the example of FIG. 1, reference sensors B1 to B20 are arranged to surround the periphery of the signal sensor arrangement unit 11.

Specifically, six reference sensors B1 to B6 are arranged at equal intervals in a direction parallel to the Y-axis on a negative side in a direction parallel to the X-axis with respect to the signal sensor arrangement unit 11.

Moreover, six reference sensors B6 to B11 are arranged at equal intervals in a direction parallel to the X-axis on a positive side in a direction parallel to the Y-axis with respect to the signal sensor arrangement unit 11.

Moreover, six reference sensors B11 to B16 are arranged at equal intervals in a direction parallel to the Y-axis on a positive side in the direction parallel to the X-axis with respect to the signal sensor arrangement unit 11.

Moreover, six reference sensors B16 to B20 and B1 are arranged at equal intervals in a direction parallel to the X-axis on a negative side in the direction parallel to the Y-axis with respect to the signal sensor arrangement unit 11.

In the example of FIG. 1, the equal interval in the direction parallel to the X-axis is the same as the equal interval in the direction parallel to the Y-axis. In the example of FIG. 1, the plurality of reference sensors B1 to BM are arranged near the signal sensors A1 to AL.

In the example of FIG. 1, the four reference sensors B2 to B5 parallel to the Y-axis are arranged at the same positions on the Y-axis as the four signal sensors A1 to A4 parallel to the Y-axis, respectively.

Likewise, the four reference sensors B12 to B15 parallel to the Y-axis are arranged at the same positions on the Y-axis as the four signal sensors A4, A3, A2, and A1 parallel to the Y-axis, respectively.

Moreover, in the example of FIG. 1, the four reference sensors B7 to B10 parallel to the X-axis are arranged at the same positions on the X-axis as the four signal sensors A1, A5, A9, and A13 parallel to the X-axis, respectively.

Likewise, the four reference sensors B17 to B20 parallel to the X-axis are arranged at the same position on the X-axis as the four signal sensors A13, A9, A5, and A1 parallel to the X-axis, respectively.

Here, the aspect of the arrangement (overall arrangement) of the plurality of reference sensors B1 to BM is not particularly limited and other aspects may be used.

Moreover, the arrangement (for example, a position and a direction) of the reference sensors B1 to BM is not particularly limited and various aspects may be used. For example, although an example in which the directions of the reference sensors B1 to BM are the same is shown in FIG. 1, the directions of the reference sensors B1 to BM may be arbitrary.

In addition, the names of the reference sensors are names for illustrative purposes. For example, the reference sensors may be referred to by other names such as noise sensors or (simply) sensors.

<Reference Signal (Signal Including Noise)>

The reference sensors B1 to BM measure (detect) noise (noise signals) superimposed on the target signal as reference signals. Also, the reference sensors B1 to BM obtain their measurement results (also referred to as noise measurement results for convenience of description).

Although a case in which the reference sensors B1 to BM measure noise without measuring the components of the target signal will be described in the present embodiment, a configuration in which the component of the target signal is included in a result of measuring noise in the reference sensors B1 to BM may be used to the extent that it does not interfere with practical use as another example.

Here, the noise is, for example, noise due to a signal (an interference signal) other than the target signal, and may be referred to as, for example, environmental noise or the like. The environmental noise may include, for example, a plurality of types of noise emitted from a plurality of different sources.

As a specific example, when the target signal is a magnetic signal, the noise may be a magnetic signal generated from a physical object (for example, a train or the like) other than the measurement target.

Moreover, as a specific example, when the target signal is an electromagnetic wave, the noise may be an electromagnetic wave emitted from another circuit or the like near the measurement target 31.

<Types of Signal Sensors and Types of Reference Sensors>

When a plurality of signal sensors A1 to AL are used, for example, they may all be sensors of the same type (sensors configured to measure the same physical quantity) or may include sensors of different types (sensors configured to measure different physical quantities).

When a plurality of reference sensors B1 to BM are used, for example, they may all be the sensors of the same type (sensors configured to measure the same physical quantity) or may include sensors of different types (sensors configured to measure different physical quantities).

Moreover, as the reference sensors B1 to BM, for example, sensors of a type identical to any signal sensors A1 to AL may be used or sensors of different types from the signal sensors A1 to AL may be used.

As a specific example, when a magnetic sensor is used as the signal sensors A1 to AL, a magnetic sensor may be used as the reference sensors B1 to BM or a combination of a magnetic sensor and an acceleration sensor may be used as the reference sensors B1 to BM.

In addition, for example, even if the sensors measure the same physical quantity, they may be regarded as sensors of different types when the products are different and the ratings are different.

Moreover, the orientation of each arrangement of the signal sensors A1 to AL and the orientation of each arrangement of the reference sensors B1 to BM are not particularly limited. For example, the orientation of the arrangement of one or more signal sensors A1 to AL may be the same as the orientation of the arrangement of one or more reference sensors B1 to BM or the orientation of the arrangement of the signal sensors A1 to AL may be different from the orientation of the arrangement of the reference sensors B1 to BM.

<Connection Between Information Processing Device and Each Sensor>

In the example of FIG. 1, the signal sensors A1 to AL and the information processing device 21 are communicatively connected by wire or wirelessly. Also, the information processing device 21 can acquire measurement results (detection results) of the signal sensors A1 to AL.

Moreover, the reference sensors B1 to BM and the information processing device 21 are communicatively connected by wire or wirelessly. Also, the information processing device 21 can acquire measurement results (detection results) of the reference sensors B1 to BM.

In addition, details of the connections between the information processing device 21 and the sensors (the signal sensors A1 to AL and the reference sensors B1 to BM) are omitted in the example of FIG. 1.

Here, although a case where the information processing device 21 acquires measurement results of the sensors by communicating with the sensors (the signal sensors A1 to AL and the reference sensors B1 to BM) is shown in the present embodiment, a configuration in which the information processing device 21 acquires the measurement results by outputting the measurement results from the storage medium to the information processing device 21 after the measurement results of the sensors are temporarily stored in a portable storage medium may be used as another example.

<Information Processing Device>

Figure 2:
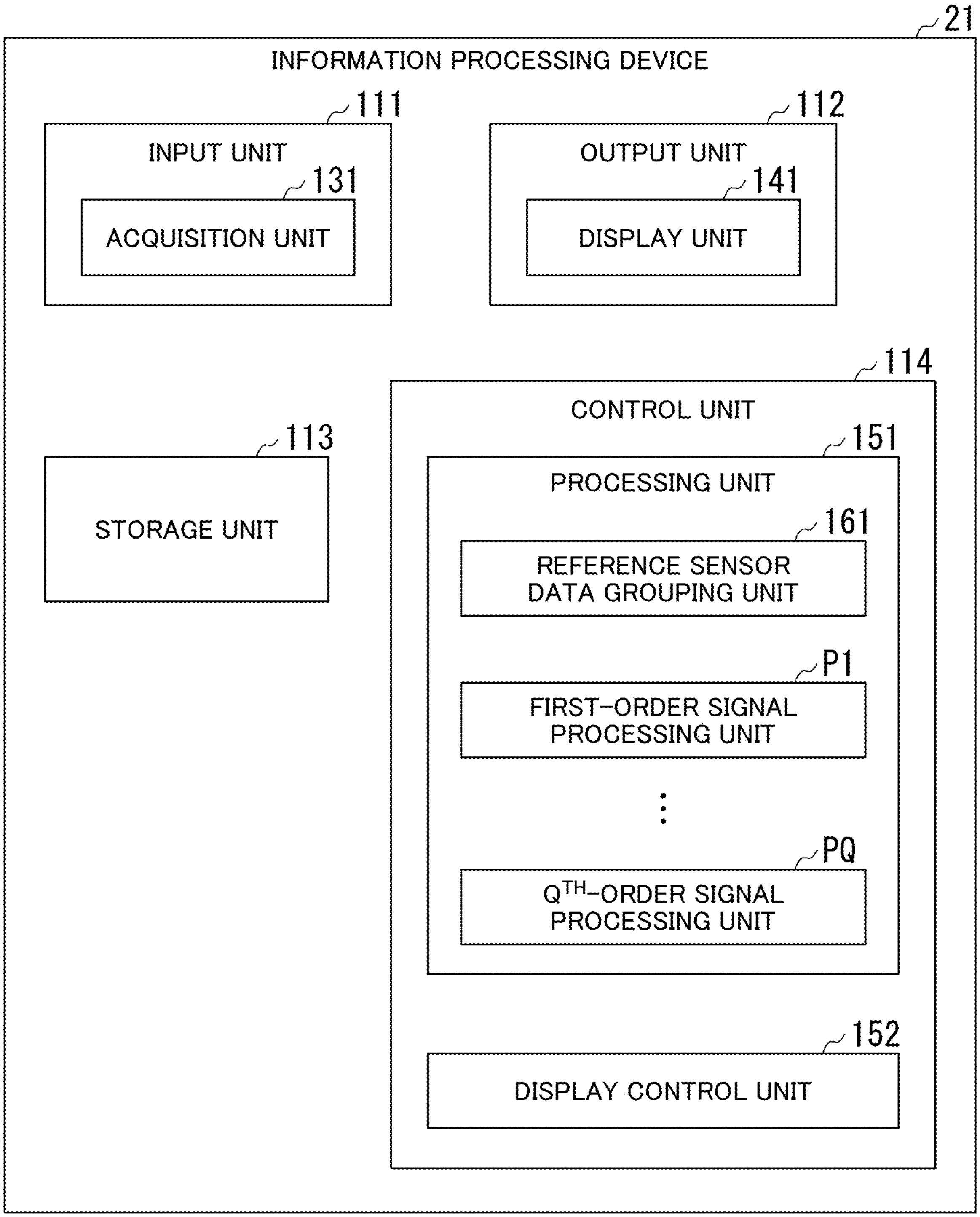
FIG. 2 is a diagram showing a schematic configuration of the information processing device according to the embodiment.

FIG. 2 is a diagram showing a schematic configuration of the information processing device 21 according to the embodiment.

The information processing device 21 includes an input unit 111, an output unit 112, a storage unit 113, and a control unit 114.

The input unit 111 includes an acquisition unit 131.

The output unit 112 includes a display unit 141.

The control unit 114 includes a processing unit 151 and a display control unit 152.

The processing unit 151 includes a reference sensor data grouping unit 161 and first- to $Q^{th}$-order signal processing units P1 to PQ that are Q signal processing units (Q is an integer of 2 or more).

In addition, the processing unit 151 may be referred to as, for example, an arithmetic unit or the like.

The input unit 111 receives an external input.

In the present embodiment, the input unit 111 inputs signals (signals of measurement results) output from the sensors (the signal sensors A1 to AL and the reference sensors B1 to BM). As a specific example, the input unit 111 may input the signals by receiving the signals transmitted from the sensors (the signal sensors A1 to AL and the reference sensors B1 to BM) or may input the signals stored in a portable storage device from the storage device.

Moreover, the input unit 111 may have, for example, a manipulation unit operated by a user, and may input information corresponding to details of the manipulation performed by the user to the manipulation unit.

The acquisition unit 131 acquires a signal input by the input unit 111.

The acquisition unit 131 may store the acquired signal in the storage unit 113.

Here, when the signal input by the input unit 111 is an analog signal, for example, the acquisition unit 131 may convert the signal from the analog signal into a digital signal by providing an analog-to-digital (A/D) conversion function.

Moreover, when the information processing device 21 is applied to real-time processing, the acquisition unit 131 acquires a signal in real time. In addition, even if the information processing device 21 is not applied to real-time processing, the acquisition unit 131 may acquire a signal in real time.

Here, although a case where the acquisition unit 131 has a function of acquiring signals measured by the signal sensors A1 to AL and a function of acquiring signals measured by the reference sensors B1 to BM is shown in the present embodiment, these functions may be separately provided as another example The output unit 112 provides an output to the outside.

The display unit 141 displays and outputs information related to a signal processing result.

The display unit 141 has a screen such as a liquid crystal display (LCD) and displays and outputs information about the signal processing result on the screen. As another configuration example, the display unit 141 may print information about the signal processing result on paper and output the paper.

In addition, the output unit 112 may have a function of performing an output process in another aspect such as an audio output function.

The storage unit 113, for example, has a storage device such as a memory and stores information.

The storage unit 113, for example, stores information such as an input signal and a signal processing result.

Moreover, the storage unit 113, for example, stores information such as a control program.

The control unit 114 performs various types of processes and various types of control.

In the present embodiment, the control unit 114 has a processor such as a central processing unit (CPU), and the processor executes a control program stored in the storage unit 113 to perform various types of processes and various types of control.

In addition, the processor includes an arithmetic device that performs various types of arithmetic operations.

The processing unit 151 performs a predetermined process on the basis of the signals of the measurement results of the signal sensors A1 to AL and the signals of the measurement results of the reference sensors B1 to BM. In the present embodiment, the predetermined process is a process of eliminating the noise from a mixed signal between the target signal and the noise.

Here, any degree may be used as a degree to which the noise is eliminated from the mixed signal, which is an effective degree in practical use. That is, an aspect in which the noise component is completely eliminated from the mixed signal may be used or an aspect in which the noise component is eliminated from the mixed signal to a necessary extent may be used.

The noise elimination may be referred to as, for example, noise reduction, noise cancelation, or the like.

The reference sensor data grouping unit 161 classifies measurement result data (reference sensor data) of the plurality of reference sensors B1 to BM into a predetermine number (Q) of groups that are two or more groups.

In the present embodiment, the plurality of reference sensors B1 to BM are classified into the Q groups in advance. Also, reference sensor data items of the reference sensors B1 to BM are classified into groups to which the reference sensors B1 to BM belong.

That is, in the present embodiment, a process in which the plurality of reference sensors B1 to BM are classified into the Q groups is the same as a process in which the plurality of reference sensor data items acquired by the plurality of reference sensors B1 to BM are classified into the Q groups.

Here, an aspect in which the plurality of reference sensors B1 to BM are classified into two or more groups (i.e., an aspect in which a plurality of reference sensor data are classified into two or more groups) is not particularly limited. For example, an aspect in which a classification process is performed on the basis of the order of arrangement of the reference sensors B1 to BM, an aspect in which a classification process is performed on the basis of arrangement locations of the reference sensors B1 to BM, an aspect in which a classification process is performed on the basis of arrangement orientations of the reference sensors B1 to BM, an aspect in which a classification process is performed on the basis of the types of the reference sensors B1 to BM, and the like may be used.

As a specific example, as an aspect in which classification into two groups is performed on the basis of the order of arrangement of the reference sensors B1 to BM, an aspect in which a plurality of reference sensors arranged in a predetermined direction are classified into an odd-numbered reference sensor group of the first, third, and fifth reference sensors and an even-numbered reference sensor group of the second, fourth, and sixth reference sensors may be used. Likewise, an aspect in which classification into three or more groups is performed on the basis of the order of arrangement of the reference sensors B1 to BM may be used.

As a specific example, as an aspect in which classification into two groups is performed on the basis of arrangement locations of the reference sensors B1 to BM, an aspect in which a region where the reference sensors B1 to BM are distributed is divided into two regions and the reference sensors arranged in each region are designated as reference sensors of the same group (i.e., an aspect in which classification according to each location where the reference sensor is arranged is performed) may be used. Likewise, an aspect in which classification into three or more groups is performed on the basis of arrangement locations of the reference sensors B1 to BM may be used.

As a specific example, as an aspect in which classification into two groups is performed on the basis of arrangement orientations of the reference sensors B1 to BM, an aspect in which the arrangement orientations of the reference sensors B1 to BM are classified into two types of groups and the reference sensors are classified into groups to which the arrangement orientations belongs (for example, an aspect in which the reference sensors are classified according to each arrangement orientation) may be used. Likewise, an aspect in which classification into three or more groups is performed on the basis of the arrangement orientations of the reference sensors B1 to BM may be used.

As a specific example, as an aspect in which classification into two groups is performed on the basis of types of the reference sensors B1 to BM, an aspect in which classification into two groups is performed in accordance with the types of the reference sensors B1 to BM (an aspect in which the reference sensors are classified according to each type thereof) may be used. Likewise, an aspect in which classification into three or more groups is performed on the basis of the types of the reference sensors B1 to BM may be used.

Here, in the present embodiment, each group includes one or more reference sensor data items (one or more reference sensors).

Moreover, in the present embodiment, grouping is performed so that the same reference sensor data (the same reference sensor) is not assigned to two or more different groups at the same time.

Moreover, in the present embodiment, an aspect (a grouping method) in which a plurality of reference sensor data (a plurality of reference sensors) are grouped is stored in advance in the information processing device 21 (e.g., the storage unit 113 or the like). Also, the reference sensor data grouping unit 161 groups reference sensor data on the basis of the aspect. In this case, corresponding relationships between reference sensor data items (reference sensors) and groups are set in advance.

As a specific example, when the measurement device 1 is shipped as a product, a grouping aspect (the corresponding relationship) may be set in the information processing device 21 before shipment and the grouping aspect (the corresponding relationship) may be fixed after shipment. Moreover, for example, if necessary, the grouping aspect (the corresponding relationship) set in the information processing device 21 may be adjusted (changed) according to human determination before shipment.

The first- to $Q^{th}$-order signal processing units P1 to PQ perform a process of eliminating noise included in measurement results using data of the measurement results of the signal sensors A1 to AL and reference sensor data classified into Q groups.

A method of a process of a signal processing unit of each order is not particularly limited. For example, a method of adaptive noise canceling (ANC) that is a method of eliminating noise and the like may be used.

The display control unit 152 displays and outputs various types of information on a screen of the display unit 141.

[Specific Example of Environmental Noise Elimination Process]

In this example, for convenience of description, the noise superimposed on the target signal will be referred to as environmental noise.

A specific example of an environmental noise cancelation process performed by the information processing device 21 is shown with reference to FIGS. 3 to 6.

In the present embodiment, for convenience of description, a portion in which the L signal sensors A1 to AL are combined is referred to as a signal sensor unit 331, a portion in which the M reference sensors B1 to BM are combined is referred to as a reference sensor unit 332, and a portion in which the signal sensor unit 331 and the reference sensor unit 332 are combined is referred to as a sensor unit 311.

The signal sensor unit 331 and the reference sensor unit 332 are provided separately, i.e., the signal sensors A1 to AL and the reference sensors B1 to BM do not have sensors common to both of them.

Specific Example of Process According to First Configuration Example

Figure 3:
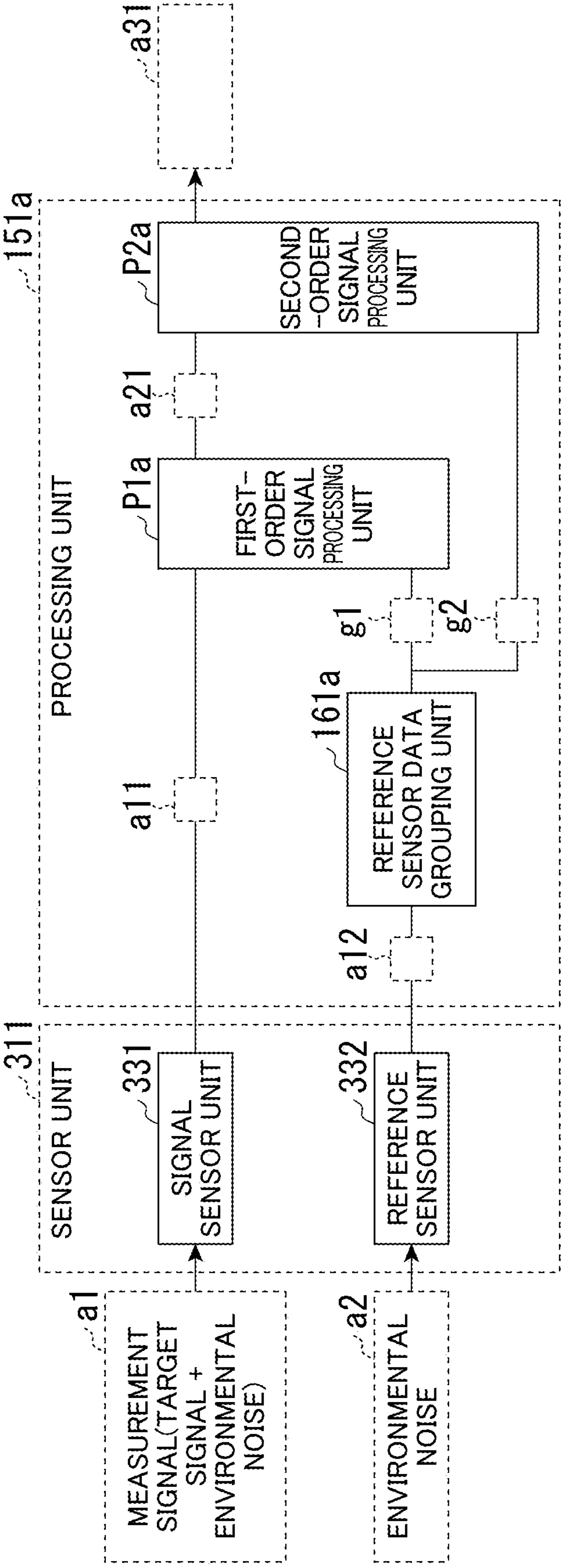
FIG. 3 is a diagram schematically showing a flow of a process according to a first configuration example of the embodiment.

FIG. 3 is a diagram schematically showing a flow of a process according to the first configuration example of the embodiment.

FIG. 3 shows a sensor unit 311 including a signal sensor unit 331 and a reference sensor unit 332, and a processing unit 151*a*.

Here, the processing unit 151*a* is an example of the processing unit 151 shown in FIG. 2.

The processing unit 151*a* includes a reference sensor data grouping unit 161*a*, a first-order signal processing unit P1*a*, and a second-order signal processing unit P2*a*. This example is an example in which two-stage signal processing is performed.

Here, the reference sensor data grouping unit 161*a*, the first-order signal processing unit P1*a*, and the second-order signal processing unit P2*a* are examples of the reference sensor data grouping unit 161, the first-order signal processing unit P1, and the second-order signal processing unit P2 in FIG. 2.

A specific example of the process in this example will be described.

When the measurement signal a1 (a mixed signal in this example) is measured by the signal sensor unit 331, signal sensor data a11, which is data of the measurement signal a1, is obtained. The signal sensor data a11 includes signal sensor data of the signal sensors A1 to AL.

Here, in this example, the measurement signal a1 includes a target signal and environmental noise.

Moreover, the environmental noise signal a2 (an example of a reference signal and the same applies thereafter) is measured by the reference sensor unit 332, and therefore a reference sensor data a12 that is data of the environmental noise signal a2 is obtained. The reference sensor data a12 includes reference sensor data of the reference sensors B1 to BM.

The reference sensor data grouping unit 161 groups the reference sensor data a12.

In this example, the reference sensor data grouping unit 161a classifies the plurality of reference sensor data included in the reference sensor data a12 into two groups such as a first group and a second group.

In this example, for convenience of description, a set of reference sensor data of the first group (which may be one reference sensor data item) is referred to as first group data g1 and a set of reference sensor data of the second group (which may be one reference sensor data item) is referred to as second group data g2.

The first-order signal processing unit P1*a* performs a predetermined process using the signal sensor data a11 and the first group data g1 and generates first-order signal-processed data a21 that is data of a result of the process.

Here, the process is a process of eliminating environmental noise included in the signal sensor data a11 using the first group data g1.

The second-order signal processing unit P2*a* performs a predetermined process using the first-order signal-processed data a21 and the second group data g2 and generates a second-order signal-processed data a31 that is data of a result of the process.

Here, the process is a process of eliminating environmental noise included in the first-order signal-processed data a21 using the second group data g2.

Thus, in this example, the environmental noise cancelation process is performed in two stages.

The second-order signal-processed data a31 includes an extracted target signal and becomes data from which environmental noise is eliminated.

In this example, for the signal sensor data, an environmental noise cancelation process is performed using one group of reference sensor data according to signal processing of each order. On the other hand, in this example, for the reference sensor data, initial data (the reference sensor data a12 in the example of FIG. 3) is used for the environmental noise cancelation process.

Specific Example of Process According to Second Configuration Example

Figure 4:
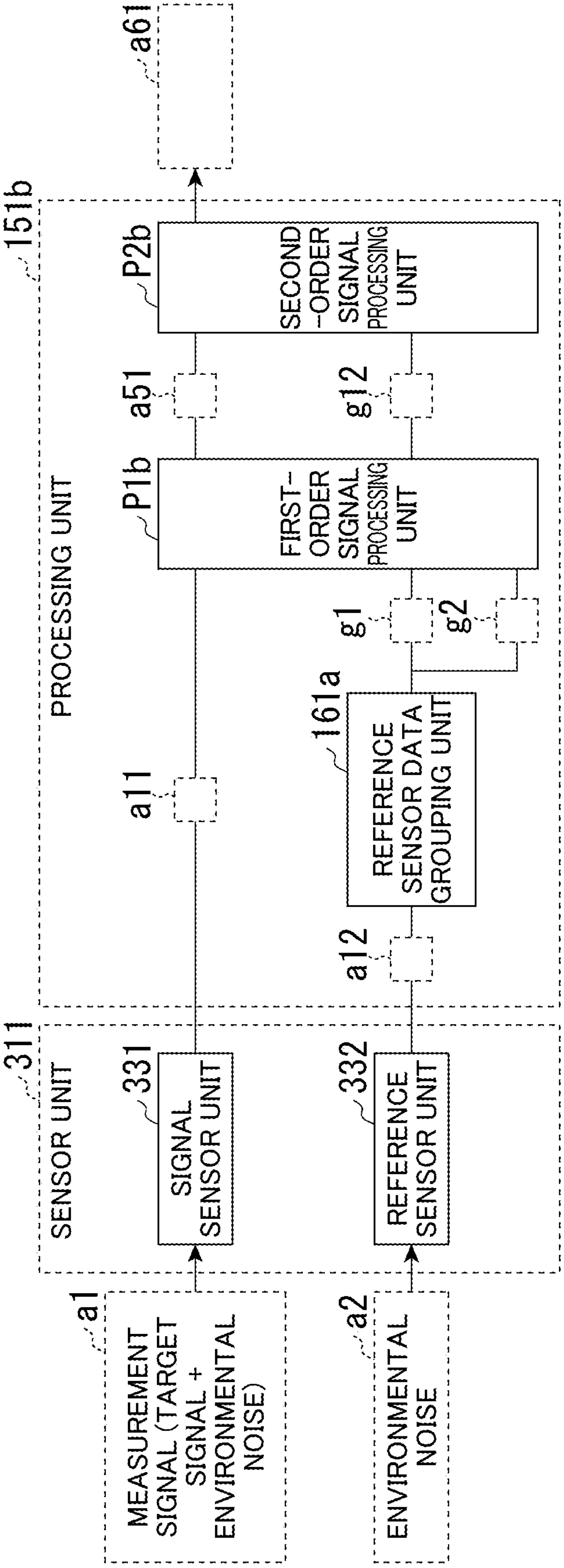
FIG. 4 is a diagram schematically showing a flow of a process according to a second configuration example of the embodiment.

FIG. 4 is a diagram schematically showing a flow of a process according to a second configuration example of the embodiment.

FIG. 4 shows a sensor unit 311 including a signal sensor unit 331 and a reference sensor unit 332, and a processing unit 151*b*.

Here, the processing unit 151*b* is an example of the processing unit 151 shown in FIG. 2.

The processing unit 151*b* includes a reference sensor data grouping unit 161*a*, a first-order signal processing unit P1*b*, and a second-order signal processing unit P2*b*. This example is an example in which two-stage signal processing is performed.

Here, the first-order signal processing unit P1*b* and the second-order signal processing unit P2*b* are examples of the first-order signal processing unit P1 and the second-order signal processing unit P2 in FIG. 2.

A specific example of the process in this example will be described.

In this example, a process until the signal sensor data a11, the first group data g1, and the second group data g2 are obtained is similar to that in the first configuration example and a subsequent process is different from that in the first configuration example. For this reason, in the example of FIG. 4, parts similar to those in the first configuration example are denoted by the same reference signs.

In this example, the signal sensor data a11, the first group data g1, and the second group data g2 are input to the first-order signal processing unit P1*b*.

The first-order signal processing unit P1*b* performs a predetermined process using the signal sensor data a11 and the first group data g1 and generates first-order signal-processed data a51 that is data of a result of the process.

Here, the process is a process of eliminating environmental noise included in the signal sensor data a11 using the first group data g1.

In addition, when a similar process for an input as in the first-order signal processing in the first configuration example is performed as the process, the first-order signal-processed data a51 is the same as the first-order signal-processed data a21 shown in FIG. 3.

Moreover, the first-order signal processing unit P1*b* performs a predetermined process using the second group data g2 and the first group data g1 and generates first-order signal-processed second group data g12 that is data of a result of the process.

Here, the process is a process of eliminating environmental noise included in the second group data g2 using the first group data g1.

The second-order signal processing unit P2*b* performs a predetermined process using the first-order signal-processed data a51 and the first-order signal-processed second group data g12 and generates second-order signal-processed data a61 that is data of a result of the process.

Here, the process is a process of eliminating environmental noise included in the first-order signal-processed data a51 using the first-order signal-processed second group data g12.

Thus, in this example, the environmental noise cancelation process is performed in two stages.

The second-order signal-processed data a61 includes the extracted target signal and becomes data from which environmental noise is eliminated.

In this example, for the signal sensor data, an environmental noise cancelation process is performed using one group of reference sensor data according to signal processing of each order. Moreover, in this example, the environmental noise cancelation process is performed using reference sensor data of the other group for the reference sensor data of the group used for second-order signal processing.

Specific Example of Process According to Third Configuration Example

Figure 5:
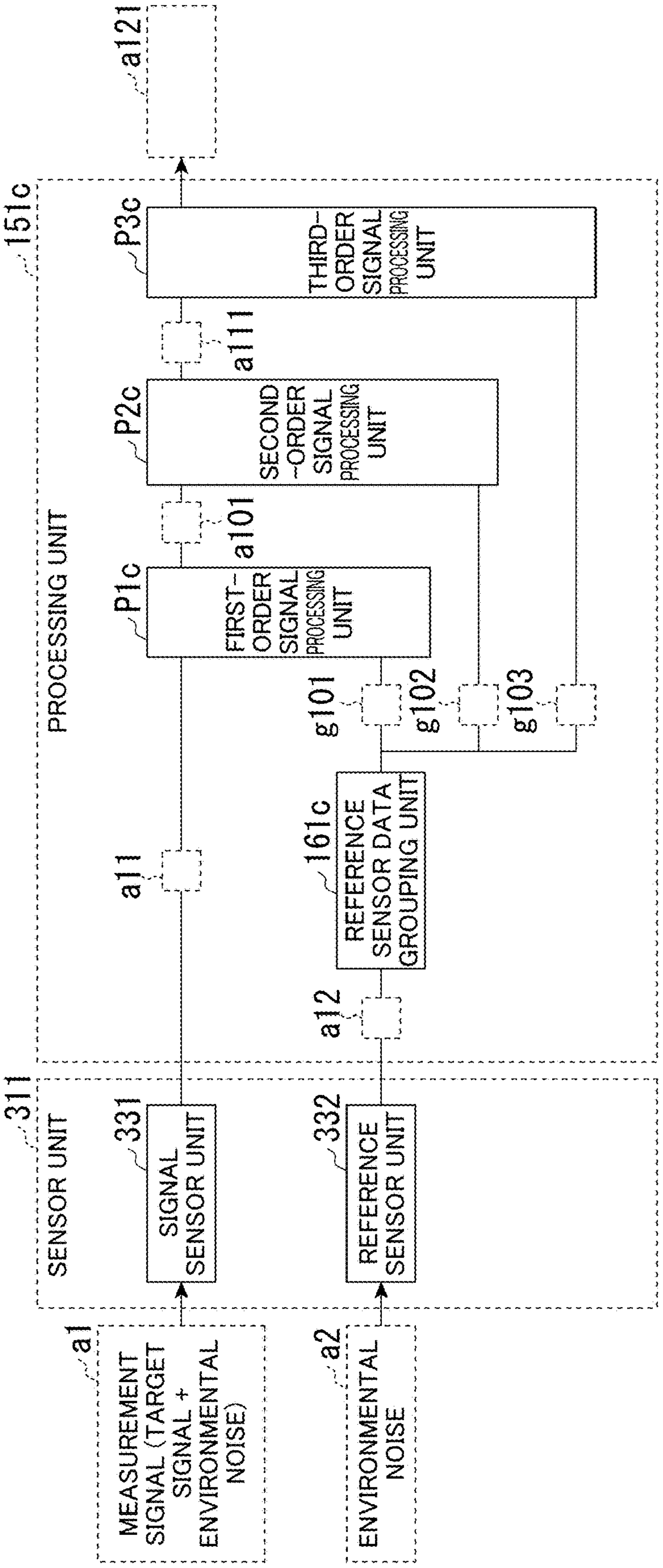
FIG. 5 is a diagram schematically showing a flow of a process according to a third configuration example of the embodiment.

FIG. 5 is a diagram schematically showing a flow of a process according to the third configuration example of the embodiment.

FIG. 5 shows a sensor unit 311 including a signal sensor unit 331 and a reference sensor unit 332, and a processing unit 151*c*.

Here, the processing unit 151*c* is an example of the processing unit 151 shown in FIG. 2.

The processing unit 151*c* includes a reference sensor data grouping unit 161*c*, a first-order signal processing unit Plc, a second-order signal processing unit P2*c*, and a third-order signal processing unit P3*c*. This example is an example in which three-stage signal processing is performed.

Here, the reference sensor data grouping unit 161*c*, the first-order signal processing unit Plc, the second-order signal processing unit P2*c*, and the third-order signal processing unit P3*c* are examples of the reference sensor data grouping unit 161, the first-order signal processing unit P1, the second-order signal processing unit P2, and the third-order signal processing unit P3 in FIG. 2.

A specific example of the process in this example will be described.

In this example, a process until the signal sensor data a11 and the reference sensor data a12 are obtained is similar to that in the first configuration example and a subsequent process is different from that in the first configuration example. For this reason, in the example of FIG. 5, parts similar to those in the first configuration example are denoted by the same reference signs.

The reference sensor data grouping unit 161*c* groups the reference sensor data a12.

In this example, the reference sensor data grouping unit 161*c* classifies a plurality of reference sensor data included in the reference sensor data a12 into three groups such as a first group, a second group, and a third group.

In this example, for convenience of description, a set of reference sensor data of the first group (which may be one reference sensor data item) is referred to as first group data g101, a set of reference sensor data of the second group (which may be one reference sensor data item) is referred to as second group data g102, and a set of reference sensor data of the third group (which may be one reference sensor data item) is referred to as third group data g103.

The first-order signal processing unit Plc performs a predetermined process using the signal sensor data a11 and the first group data g101 and generates first-order signal-processed data a101 that is data of a result of the process.

Here, the process is a process of eliminating environmental noise included in the signal sensor data a11 using the first group data g101.

The second-order signal processing unit P2*c* performs a predetermined process using the first-order signal-processed data a101 and the second group data g102 and generates second-order signal-processed data a111 that is data of a result of the process.

Here, the process is a process of eliminating environmental noise included in the first-order signal-processed data a101 using the second group data g102.

The third-order signal processing unit P3*c* performs a predetermined process using the second-order signal-processed data a111 and the third group data g103 and generates the third-order signal-processed data a121 that is data of a result of the process.

Here, the process is a process of eliminating environmental noise included in the second-order signal-processed data a111 using the third group data g103.

Thus, in this example, the environmental noise cancelation process is performed in three stages.

The third-order signal-processed data a121 includes an extracted target signal and becomes data from which environmental noise is eliminated.

In this example, for the signal sensor data, an environmental noise cancelation process is performed using one group of reference sensor data according to signal processing of each order. On the other hand, in this example, for the reference sensor data, the initial data (the reference sensor data a12 in the example of FIG. 3) is used for the environmental noise cancelation process.

Although a configuration example in which first- to third-order signal processing units of three stages are used has been described in the present embodiment, for example, a configuration in which signal processing units of four or more stages are used may be adopted. In this case, the number of groups identical to the number of stages of the signal processing units is set.

Specific Example of Process According to Fourth Configuration Example

Figure 6:
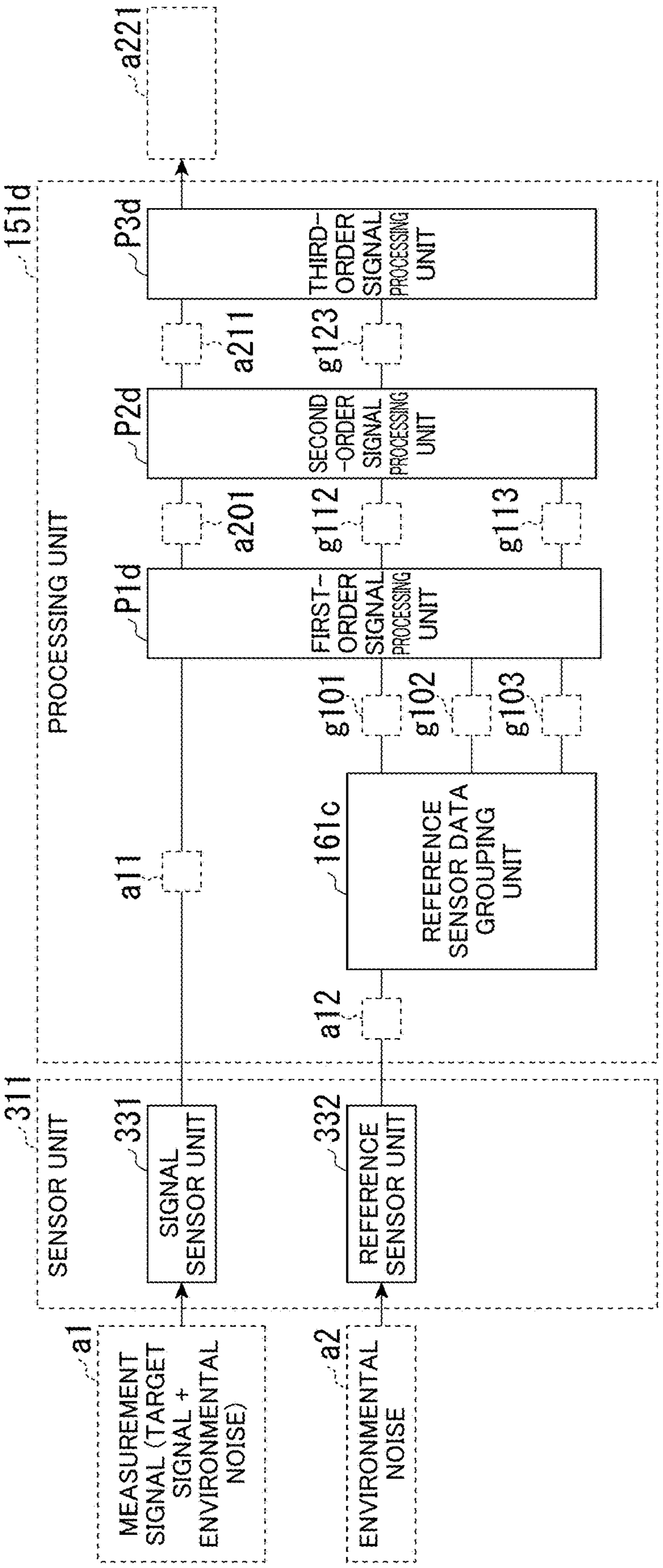
FIG. 6 is a diagram schematically showing a flow of a process according to a fourth configuration example of the embodiment.

FIG. 6 is a diagram schematically showing a flow of a process according to a fourth configuration example of the embodiment.

A sensor unit 311 including a signal sensor unit 331 and a reference sensor unit 332 and a processing unit 151*d* are shown in FIG. 6.

Here, the processing unit 151*d* is an example of the processing unit 151 shown in FIG. 2.

The processing unit 151*d* includes a reference sensor data grouping unit 161*c*, a first-order signal processing unit P1*d*, a second-order signal processing unit P2*d*, and a third-order signal processing unit P3*d*. This example is an example in which three-stage signal processing is performed.

Here, the first-order signal processing unit P1*d*, the second-order signal processing unit P2*d*, and the third-order signal processing unit P3*d* are examples of the first-order signal processing unit P1, the second-order signal processing unit P2, and the third-order signal processing unit P3 in FIG. 2.

A specific example of the process in this example will be described.

In this example, a process until the signal sensor data a11, the first group data g101, the second group data g102, and the third group data g103 are obtained is similar to that in the third configuration example and a subsequent process is different from that in the third configuration example. For this reason, in the example of FIG. 6, parts similar to those in the third configuration example are denoted by the same reference signs.

In this example, the signal sensor data a11, the first group data g101, the second group data g102, and the third group data g103 are input to the first-order signal processing unit P1*d*.

The first-order signal processing unit P1*d* performs a predetermined process using the signal sensor data a11 and the first group data g101 and generates first-order signal-processed data a201 that is data of a result of the process.

Here, the process is a process of eliminating environmental noise included in the signal sensor data a11 using the first group data g101.

In addition, as the process, when a similar process is performed for an input as in the first-order signal processing in the third configuration example, the first-order signal-processed data a201 is the same as the first-order signal-processed data a101 shown in FIG. 5.

Moreover, the first-order signal processing unit P1*d* performs a predetermined process using the second group data g102 and the first group data g101 and generates first-order signal-processed second group data g112 that is data of a result of the process.

Here, the process is a process of eliminating environmental noise included in the second group data g102 using the first group data g101.

Moreover, the first-order signal processing unit P1*d* performs a predetermined process using the third group data g103 and the first group data g101 and generates first-order signal-processed third group data g113 that is data of a result of the process.

Here, the process is a process of eliminating environmental noise included in the third group data g103 using the first group data g101.

The second-order signal processing unit P2*d* performs a predetermined process using the first-order signal-processed data a201 and the second group data g112 after the first-order signal processing and generates second-order signal-processed data a211 that is data of a result of the process.

Here, the process is a process of eliminating environmental noise included in the first-order signal-processed data a201 using first-order signal-processed second group data g112.

Moreover, the second-order signal processing unit P2*d* performs a predetermined process using the first-order signal-processed third group data g113 and the first-order signal-processed second group data g112 and generates second-order signal-processed third group data g123 that is data of a result of the process.

Here, the process is a process of eliminating environmental noise included in the first-order signal-processed third group data g113 using the first-order signal-processed second group data g112.

The third-order signal processing unit P3*d* performs a predetermined process using the second-order signal-processed data a211 and the second-order signal-processed third group data g123 and generates third-order signal-processed data a221 that is data of a result of the process.

Here, the process is a process of eliminating environmental noise included in the second-order signal-processed data a211 using the second-order signal-processed third group data g123.

Thus, in this example, the environmental noise cancelation process is performed in three stages.

Third-order signal-processed data a221 includes an extracted target signal and becomes data from which environmental noise is eliminated.

In this example, for the signal sensor data, an environmental noise cancelation process is performed using one group of reference sensor data according to signal processing of each order. Moreover, in this example, the environmental noise cancelation process is performed using reference sensor data of the other group for the reference sensor data of the group used for second- and subsequent-order signal processing.

Although a configuration example in which first- to third-order signal processing units of three stages are used has been described in the present embodiment, for example, a configuration in which signal processing units of four or more stages are used may be adopted. In this case, the number of groups identical to the number of stages of the signal processing units is set.

Here, in this example, in the signal processing unit of each order, a configuration in which the reference sensor data of the group output to the signal processing unit of the next order is always performed in an environmental noise cancelation process using reference sensor data of the other group has been described. However, as another example, this environmental noise cancelation process (i.e., the environmental noise cancelation process for reference sensor data of each group) may be performed for only partial data.

[Example of Waveform after Environmental Noise Cancelation]

Figure 7:
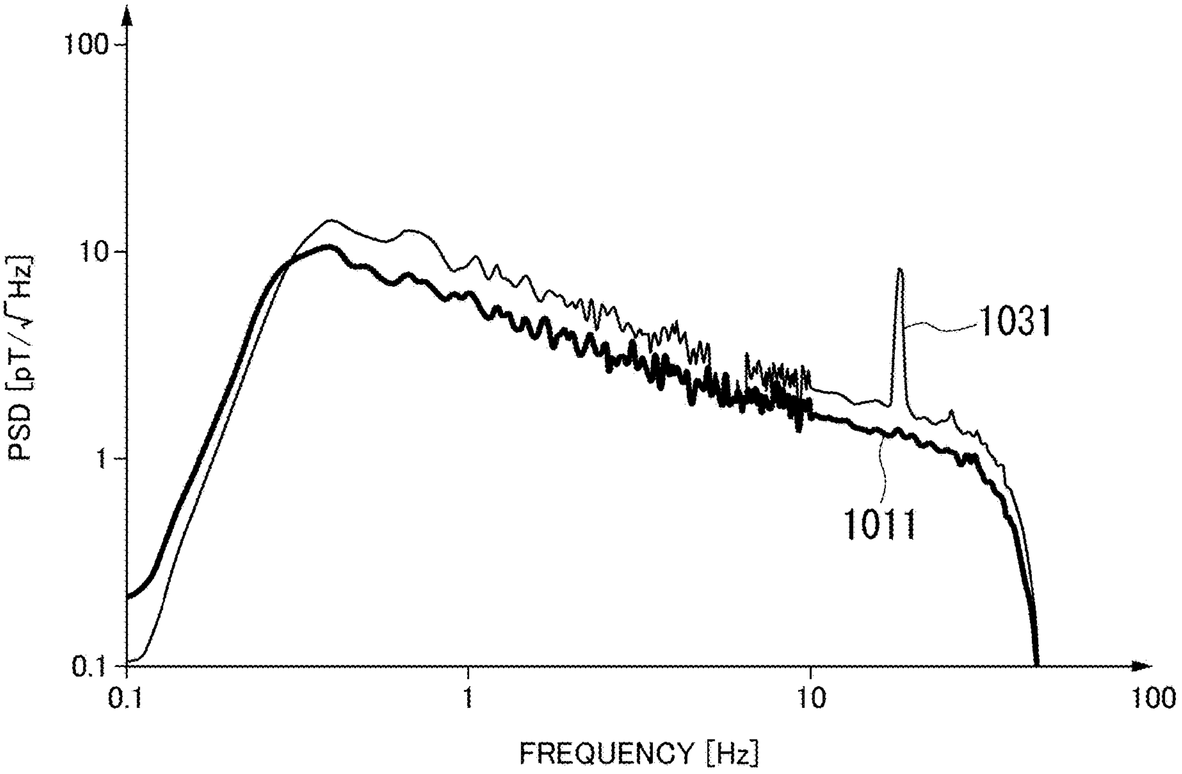
FIG. 7 is a diagram showing an example of a noise density after signal processing according to the embodiment.

FIG. 7 is a diagram showing an example of a noise density after signal processing according to the embodiment.

In the graph shown in FIG. 7, the horizontal axis represents frequency [Hz] and the vertical axis represents a power spectral density function (PSD) [pT/√Hz].

The graph shows a characteristic 1011 of results obtained by the environmental noise cancelation method according to the present embodiment and a characteristic 1031 of results obtained by an environmental noise cancelation method according to a comparative example.

Here, as the environmental noise cancelation method according to the present embodiment, the method according to the first configuration example shown in FIG. 3 (a two-stage environmental noise cancelation method) is used.

Specifically, in the environmental noise cancelation method according to the present embodiment, 18 reference sensors (reference sensors B1 to B18) are classified into two groups (the first group and the second group) each having 9 reference sensors. An environmental noise cancelation process based on predetermined frequency-division ANC (a method described using FIGS. 8 and 9 to be described below) is performed for the signal sensor data using the reference sensor data of the first group in the first-order signal processing unit P1. An environmental noise cancelation process based on ANC is performed for data of a result of first-order signal processing using the reference sensor data of the second group in the second-order signal processing unit P2.

Moreover, as the environmental noise cancelation method according to the comparative example, a one-stage environmental noise cancelation method is used.

Specifically, in the environmental noise cancelation method according to the comparative example, the environmental noise cancelation process based on ANC is performed for the signal sensor data using the reference sensor data of 18 reference sensors.

As shown in FIG. 7, the environmental noise cancelation method according to the present embodiment has higher accuracy of environmental noise cancelation than the environmental noise cancelation method according to the comparative example.

[Example of Signal Processing]

Various types of signal processing may be used as signal processing performed by each of the first- to $Q^{th}$-order signal processing units P1 to PQ.

Moreover, various combinations may be used as a combination of a plurality of stages of signal processing of a plurality of stage signal processing units.

In the plurality of stage signal processing units, for example, an embodiment in which all signal processing procedures are different processing procedures may be used or an embodiment in which two or more signal processing procedures are the same processing procedure may be used.

As an example, the ANC method may be used as a signal processing method.

As another example, as a signal processing method, a method using frequency-division ANC (referred to as frequency-division ANC in the present embodiment) may be used.

For example, in a configuration in which first-order signal processing and second-order signal processing are performed, the first-order signal processing and the second-order signal processing may be a process of ANC and a process of ANC, a process of ANC and a process of frequency-division ANC, a process of frequency-division ANC and a process of ANC, or a process of frequency-division ANC and a process of frequency-division ANC, respectively.

Moreover, in a configuration in which signal processing of three or more stages is performed, for example, ANC or frequency-division ANC may be arbitrarily assigned to signal processing.

[Specific Example of Signal Processing of Frequency-Division ANC]

An example of frequency-division ANC will be described with reference to FIGS. 8 and 9.

Figure 8:
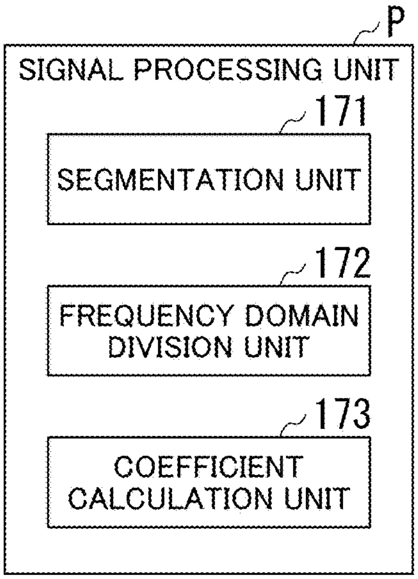
FIG. 8 is a diagram showing an example of a configuration of a signal processing unit according to the embodiment.

FIG. 8 is a diagram showing an example of a configuration of the signal processing unit P according to the embodiment.

Here, the signal processing unit P may be applied to one or more of the first- to $Q^{th}$-order signal processing units P1 to PQ.

The signal processing unit P includes a segmentation unit 171, a frequency domain division unit 172, and a coefficient calculation unit 173.

The segmentation unit 171 divides a time period into predetermined segments.

Here, various aspects may be used as the number of segments, a length of the segment (a segment length), or the like.

In addition, a length of time may be counted, for example, on the basis of the number of samples of signal data.

The frequency domain division unit 172 divides a time series signal into frequency-domain-specific signals.

The frequency domain division unit 172 may have, for example, a function of a Fourier transform. The function may be a function of a fast Fourier transform (FFT).

In this example, frequency analysis is performed for the signals of the measurement results of all signal sensors A1 to AL and the signals of the measurement results of all reference sensors used for the frequency-division ANC.

The coefficient calculation unit 173 calculates a predetermined coefficient. In this example, the coefficient is a coefficient for noise cancelation.

In this example, for the convenience of description, description will be given using mathematical formula under the assumption that all reference sensors B1 to BM are used for frequency-division ANC. When only some reference sensors are used as in the present embodiment, the reference sensor in the following description is limited to some reference sensors (a specific group of reference sensors in the present embodiment).

In this example, the signal processing unit P performs analysis for one of the plurality of frequency domains for each of the plurality of time segments. In the analysis, for example, an ANC method that is a noise cancelation method may be used. Normally, the ANC method is executed for a whole time series without using a plurality of time segments.

Signal data of the measurement results obtained by one or more signal sensors A1 to AL is denoted by y(f). The signal data y(f) is, for example, a result of FFT performed for the measurement result.

In this example, f denotes a frequency component and (f) denotes a function of f.

Here, the signal data y(f) may be, for example, signal data of a measurement result of one signal sensor Aj (j=1 to L), or signal data obtained as a result of performing a predetermined arithmetic operation for the measurement result of each of the two or more signal sensors Aj. As the predetermined arithmetic operation, for example, an arithmetic operation such as averaging may be used.

Signal data of a measurement result of an $i^{th}$ (i=1 to M) reference sensor Bi is denoted by $x_i$(f). The signal data $x_i$(f) is, for example, a result of FFT performed for the measurement result.

In this case, signal data v(f) of a result of eliminating noise from the signal data y(f) is denoted by Eq. (1).

Here, $w_1$ to $w_M$ are filter coefficients for weighting and a vector having M filter coefficients as a component is denoted by a vector w.

$$v(f) = y(f) - w_1x_1(f) - w_2x_2(f) - \dots - w_Mx_M(f) \tag{1}$$

Eq. (1) is obtained by calculating Eq. (2).

In Eq. (2), $\Sigma_{yx}$ is obtained by general calculation.

$$\sum\nolimits_{xx}^{-1}$$

is the inverse of a covariance matrix Σxx of the measurement results of the reference sensors B1 to BM.

$$w = \begin{bmatrix} w_1 \\ w_2 \\ \vdots \\ w_M \end{bmatrix} = \sum\nolimits_{yx}\sum\nolimits_{xx}^{-1} \tag{2}$$

The calculation of the covariance matrix Σxx will be described.

The measurement results of the plurality of reference sensors B1 to BM are denoted by a vector x(f) denoted by Eq. (3).

$$x(f) = \begin{bmatrix} x_1(f) \\ x_2(f) \\ \vdots \\ x_M(f) \end{bmatrix} \tag{3}$$

The covariance matrix Σxx is calculated by Eq. (4). * denotes conjugate transpose.

$$\sum\nolimits_{xx} = \sum\nolimits_{r=1}^{N}(x_r(f)x_r(f)^*) \tag{4}$$

Here, N denotes the number of segments (the total number of segments) when the signal data is divided into a plurality of segments.

There is a vector x(f) for each segment and there are N vectors x(f) for N segments in general.

In order to obtain a stable value, it is necessary to set N to a certain magnitude. N affects the calculation accuracy of the vector w of the filter coefficient.

In order to stably calculate the inverse matrix $$\sum\nolimits_{xx}^{-1}$$

of the covariance matrix Σxx, in general, about N>3 M to 10 M is required.

In this example, in order to stabilize the calculation result by N, regularization represented by Expression (5) is performed. Regularization can prevent, for example, excessive estimation.

Here, γ denotes a regularization parameter, which is generally set to $10^{-2}$ to $10^{-6}$ times a maximum eigenvalue of the covariance matrix. I denotes the identity matrix.

$$\sum_{xx} \rightarrow \sum_{xx} + \gamma\lambda \max\left(\sum_{xx}\right) I \tag{5}$$

<Segmentation>

Figure 9:
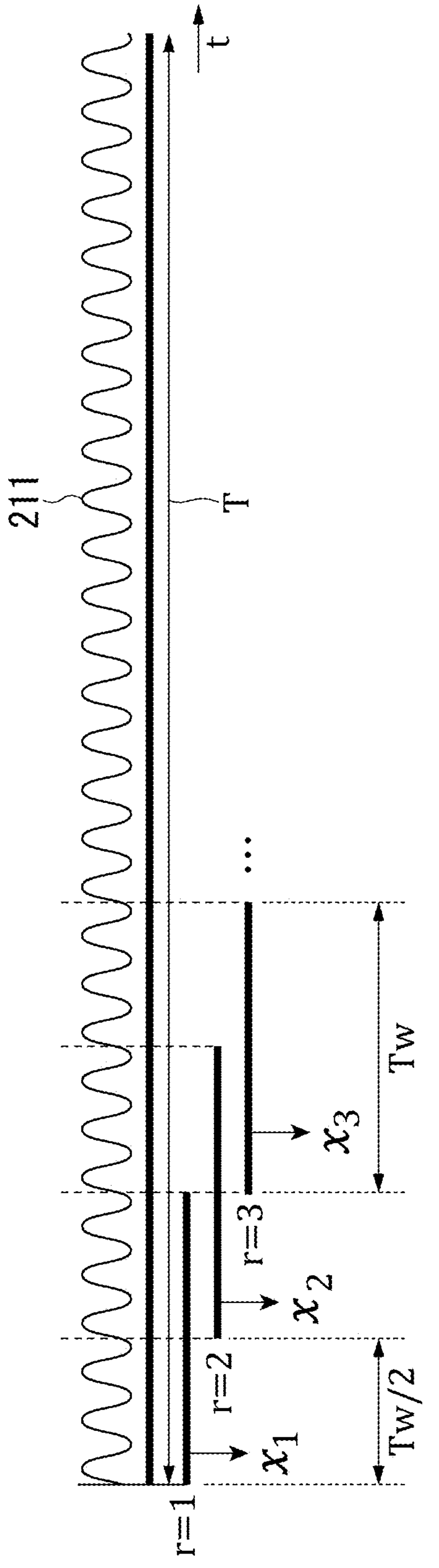
FIG. 9 is a diagram showing an example of segmentation.

FIG. 9 is a diagram showing an example of segmentation.

In FIG. 9, an axis representing time (t) is shown as a horizontal axis.

Moreover, in FIG. 9, an example of signal data 211 of a time series signal is shown. The example of FIG. 9 shows a case where the time series signal is a sine wave, but is not limited thereto.

In the example of FIG. 9, the overall length of the signal data 211 to be processed is expressed by a period T.

Here, the signal data 211 is signal data obtained from the measurement results of the signal sensors A1 to AL. A length (a signal data length) of the signal data 211 corresponds to a period (a time length) of the measurement result. In the present embodiment, a sampling period of the signal data 211 is a predetermined period (for example, a constant period).

Moreover, the total number of segments into which the period T is divided is N.

N segments are $r^{th}$ (r=1 to N) segments.

In the example of FIG. 9, they are arranged from the early time to the late time in order from the segment of r=1 to the segment of r=N.

In this example, all segments have the same length (segment length). The length of the segment is denoted by Tw.

Moreover, in the example of FIG. 9, an $r^{th}$ segment and an $(r+1)^{th}$ segment, which are two adjacent segments, overlap by ½ of the segment length (i.e., Tw/2).

Here, the total number N of segments is expressed as Expression (6) as approximation using the entire period T and the segment length Tw.

$$N \sim T/(Tw/2) \tag{6}$$

Thus, in this example, the covariance matrix Σxx can be calculated by dividing the signal having a total data length T into segments each having a segment length Tw and calculating N vectors x(f) with the data included in each segment, and therefore a noise cancelation result is calculated.

For example, it is necessary to increase the number of reference sensors B1 to BM so that it is possible to eliminate various types of environmental noise. However, in the method of this example, it is possible to set N in an optimal range by changing the segment length Tw of a data segment.

Here, although a case where two adjacent segments overlap by ½ of the segment length is shown in this example, an overlap degree may be arbitrary. For example, an aspect in which two adjacent segments may be in contact without overlap may be used.

The following content can be expressed approximately. That is, when two adjacent segments overlap by more than ½ of the segment length, the discrete data sampled in the time window does not contain components above a Nyquist frequency and does not cause so-called aliasing. In contrast, if the overlap is less than or equal to ½ of the segment length, there is a possibility that aliasing will occur.

Moreover, although a case where all segments have the same segment length is shown in this example, a plurality of segments may include segments with different segment lengths.

Thus, in the frequency-division ANC in this example, signal measurement results of one or more signal sensors that measure a mixed signal in which the target signal and noise are mixed and noise measurement results of a plurality of reference sensors that measure the noise are acquired. Also, in the method, for each of time segments, each of the acquired signal measurement result and noise measurement result is divided into a plurality of frequency domains and signal processing is performed to eliminate noise included in the mixed signal.

For example, the signal processing units use two adjacent segments which have the same segment length as the segments and in which ½ of the segment length overlaps.

The segment is decided, for example, on the basis of the number of reference sensors and a signal data length of a signal processing target.

For example, the signal processing unit performs signal processing based on calculation using a covariance matrix, and the regularization parameter for adjusting the degree of regularization when the covariance matrix is regularized is decided on the basis of the number of reference sensors and a signal-to-noise ratio of the signal sensor data in the segment.

SUMMARY OF EMBODIMENTS

As described above, in the measurement device 1 according to the present embodiment, the plurality of reference sensors B1 to BM can be used to increase the accuracy of eliminating noise from the measurement result of the desired signal.

The measurement device 1 according to the present embodiment includes the plurality of reference sensors B1 to BM configured to measure noise together with the signal sensors A1 to AL for measuring a target signal. A plurality of reference sensor data items acquired by the plurality of reference sensors B1 to BM are classified into two or more groups. Using these groups, signal processing units of two or more stages perform the same type of signal processing or different types of signal processing.

Therefore, signal processing of two or more stages is combined by using a plurality of groups, and therefore the effect of eliminating noise included in the measurement result can be enhanced and the accuracy of the measurement can be improved.

For example, in the measurement device 1, the added value of the measurement can be increased by combining hardware for eliminating various types of noise (interference signals other than the target signal) with a signal processing method that makes use of the hardware's features. In particular, it is possible to accurately eliminate various types of noise from the measurement signal using the plurality of reference sensors B1 to BM.

For example, the measurement device 1 can eliminate noise with unique and different characteristics by noise cancelation methods using different noise cancelation methods in multi-stage signal processing, such as using different noise cancelation methods in the first-order signal processing and the second-order signal processing. In other words, the measurement device 1 can perform noise cancelation processes corresponding to different types of noise in the signal processing of each order.

In the present embodiment, it is possible to enhance the noise cancelation effect while maintaining the same number of reference sensors and thus reduce the number of reference sensors while maintaining the noise cancelation effect.

Although a plurality of reference sensors for supporting three-axis detection are used in Patent Document 1, Patent Document 1 does not disclose or suggest, for example, that the plurality of reference sensors are used to acquire various types of noise and does not disclose or suggest that a plurality of reference sensor data items acquired by a plurality of reference sensors are grouped and signal processing is performed repeatedly a plurality of times (in a plurality of stages).

As a configuration example (hereinafter referred to as configuration example α1 for convenience of description), a measurement device 1 includes one or more signal sensors A1 to AL (measurement sensors) configured to acquire measurement signals with respect to the measurement signals measured in a state in which a target signal (a signal of interest) and environmental noise are mixed, two or more reference sensors B1 to BM configured to acquire the environmental noise, a reference sensor data grouping unit 161 configured to group reference sensor data acquired by the reference sensors B1 to BM, the first-order signal processing unit P1 configured to perform a noise cancelation process for signal sensor data acquired by the signal sensors A1 to AL using one group of the grouped reference sensor data, and a second-order signal processing unit configured to perform a noise cancelation process for first-order signal-processed data that is a processing result of the first-order signal processing unit P1 using the other group.

Therefore, in the measurement device 1, by using a plurality of reference sensor data in groups, for example, more effective signal processing can be implemented without increasing the number of reference sensors. Also, for example, it is possible to reduce the number of reference sensors without reducing the accuracy of signal processing.

Here, the measurement device 1, for example, may be configured to include three or more reference sensors B1 to BM, classify the reference sensors B1 to BM into three or more groups, and perform a noise cancelation process for a previous-stage order-specific signal-processed data using reference sensor data of one of the remaining groups from the third order.

Thereby, the measurement device 1 can further implement effective signal processing.

As another configuration example (hereinafter referred to as configuration example β1 for the convenience of description), a measurement device 1 includes one or more signal sensors A1 to AL (measurement sensors) configured to acquire measurement signals with respect to the measurement signals measured in a state in which a target signal (a signal of interest) and environmental noise are mixed, two or more reference sensors B1 to BM configured to acquire the environmental noise, a reference sensor data grouping unit 161 configured to group reference sensor data acquired by the reference sensors B1 to BM, a first-order signal processing unit P1 configured to perform a noise cancelation process for signal sensor data acquired by the signal sensors A1 to AL using one group of the grouped reference sensor data and perform a noise cancelation process for reference sensor data of another group, and a second-order signal processing unit configured to perform a noise cancelation process for first-order signal-processed data that is a result of processing the signal sensor data in the first-order signal processing unit P1 using a processing result of the other group in the first-order signal processing unit P1.

Therefore, in the measurement device 1, by using a plurality of reference sensor data in groups, for example, more effective signal processing can be implemented without increasing the number of reference sensors. Also, for example, it is possible to reduce the number of reference sensors without reducing the accuracy of signal processing.

Here, the measurement device 1, for example, includes three or more reference sensors B1 to BM and may be configured to group the reference sensors B1 to BM in three or more groups, perform a noise cancelation process for signal sensor data acquired by the signal sensors A1 to AL using one group of the grouped reference sensor data and perform a noise cancelation process for reference sensor data of another group in a first order, perform a noise cancelation process for reference sensor data of another group (data after the noise cancelation process in this example) using the reference sensor data of the one group (data after the noise cancelation process in this example) among the remaining groups except for the order of the last stage in second and subsequent orders, and perform a noise cancelation process for signal-processed data of a previous-stage order (a result of a noise cancelation process for the signal sensor data up to the previous-stage order) using the reference sensor data of the one group (data after the noise cancelation process in the this example) in all of the second and subsequent orders.

Thereby, the measurement device 1 can further implement effective signal processing.

In the configuration example α1 and the configuration example β1 described above, the reference sensors B1 to BM may include sensors of two types among sensors of types identical to those of the signal sensors A1 to AL or sensors of types different from those of the signal sensors A1 to AL.

Thereby, the measurement device 1 can eliminate environmental noise from noise sources that generate different types of noise such as, for example, magnetic noise and vibration noise (which may be, for example, two or more noise sources).

In the above-described configuration example α1 and the above-described configuration example β1, ANC may be used as a noise cancelation method in signal processing units of one or more orders.

Thereby, the measurement device 1 can perform effective noise cancelation using ANC.

In the above-described configuration example α1 and the above-described configuration example β1, ANC may be used as a noise cancelation method in signal processing units of one or more orders and frequency-division ANC may be used as a noise cancelation method in other signal processing units of one or more orders.

Thereby, the measurement device 1 can perform effective noise cancelation using a combination of ANC and frequency-division ANC, and can more effectively perform noise cancelation, for example, by performing a process of frequency decomposition for each segment according to frequency-division ANC.

In the above-described configuration example α1 and the above-described configuration example β1, the measurement device 1 may be applied, for example, when the signal sensors A1 to AL are both magnetic sensors.

Thereby, the measurement device 1 can eliminate noise superimposed on the output signals of the magnetic sensors (the signal sensors A1 to AL).

(Regarding Above Embodiments)

Also, a program for implementing the function of any constituent part of any device described above may be recorded on a computer-readable recording medium and the program may be read and executed by a computer system. Also, the "computer system" used here may include an operating system (OS) or hardware such as peripheral devices. Also, the "computer-readable recording medium" refers to a flexible disk, a magneto-optical disc, a read-only memory (ROM), a portable medium such as a compact disc-ROM (CD-ROM), or a storage device such as a hard disk embedded in the computer system. Furthermore, the "computer-readable recording medium" is assumed to include a medium that holds a program for a certain period of time, such as a volatile memory inside a computer system serving as a server or a client when the program is transmitted via a network such as the Internet or a communication circuit such as a telephone circuit. For example, the volatile memory may be a random-access memory (RAM). For example, the recording medium may be a non-transitory recording medium.

Moreover, the above-described program may be transmitted from a computer system storing the program in a storage device or the like to another computer system via a transmission medium or by transmission waves in a transmission medium. Here, the "transmission medium" for transmitting the program refers to a medium having a function of transmitting information, as in a network such as the Internet or a communication circuit such as a telephone circuit.

Moreover, the above-described program may be a program for implementing some of the above-described functions. Furthermore, the above-described program may be a so-called differential file capable of implementing the above-described function in combination with a program already recorded on the computer system. The differential file may be referred to as a differential program.

Moreover, the function of any constituent part of any device described above may be implemented by a processor. For example, each process in the embodiment may be implemented by a processor that operates on the basis of information of a program or the like and a computer-readable recording medium that stores information of a program or the like. Here, in the processor, for example, the function of each part may be implemented by individual hardware or the function of each part may be implemented by integrated hardware. For example, the processor may include hardware and the hardware may include at least one of a circuit that processes a digital signal and a circuit that processes an analog signal. For example, the processor may be configured using one or more circuit devices or/and one or more circuit elements mounted on a circuit board. An integrated circuit (IC) or the like may be used as the circuit device and a resistor, a capacitor, or the like may be used as the circuit element.

Here, the processor may be, for example, a CPU. However, the processor is not limited to the CPU and, for example, various types of processors such as a graphics processing unit (GPU) or a digital signal processor (DSP) may be used. Moreover, for example, the processor may be a hardware circuit based on an application-specific integrated circuit (ASIC). Moreover, the processor may include, for example, a plurality of CPUs, or may include a hardware circuit of a plurality of ASICs. Moreover, the processor may include, for example, a combination of a plurality of CPUs and a hardware circuit including a plurality of ASICs. Moreover, the processor may include, for example, one or more of an amplifier circuit and a filter circuit for processing an analog signal and the like.

Although embodiments of the present disclosure have been described in detail above with reference to the drawings, specific configurations are not limited to the embodiments and other designs and the like may also be included without departing from the scope of the present disclosure.

APPENDIXES (Configuration examples 1 to 7) are shown.

Configuration Example 1

A measurement device including:

a signal sensor unit having one or more signal sensors configured to measure a measurement signal in which a target signal and noise are mixed;

a reference sensor unit having Q or more reference sensors configured to measure a reference signal including the noise when Q is an integer of 2 or more; and a processing unit, wherein the processing unit includes a reference sensor data grouping unit configured to classify reference sensor data that is data of Q or more reference signals measured by the Q or more reference sensors of the reference sensor unit into first to $Q^{th}$ groups that is Q groups; and a $k^{th}$-order signal processing unit, where k is an integer of 1 or more and Q or less, wherein a first-order signal processing unit performs a noise cancelation process for signal sensor data that is data of the measurement signal measured by the signal sensor using the reference sensor data of the first group or performs a noise cancelation process for the signal sensor data that is the data of the measurement signal measured by the signal sensor and the reference sensor data of one or more groups other than the first group using the reference sensor data of the first group, wherein, when u is an integer of 2 or more and (Q−1) or less, a $u^{th}$-order signal processing unit performs a noise cancelation process for $(u-1)^{th}$-order signal-processed data after a noise cancelation process of a $(u-1)^{th}$-order signal processing unit for the signal sensor data using the reference sensor data of a $u^{th}$ group or signal-processed reference sensor data after noise cancelation processes of one or more of first- to $(u-1)^{th}$-order signal processing units for the reference sensor data of the $u^{th}$ group or performs a noise cancelation process for $(u-1)^{th}$-order signal-processed data after the noise cancelation process of the $(u-1)^{th}$-order signal processing unit for the signal sensor data and the reference sensor data of one or more groups other than the first to $u^{th}$ groups or signal-processed reference sensor data after noise cancelation processes of one or more of the first- to $(u-1)^{th}$-order signal processing units for the reference sensor data using the reference sensor data of the $u^{th}$ group or signal-processed reference sensor data after noise cancelation processes of one or more of the first- to $(u-1)^{th}$-order signal processing units for the reference sensor data of the $u^{th}$ group, and wherein a $Q^{th}$-order signal processing unit performs a noise cancelation process for $(Q-1)^{th}$-order signal-processed data after a noise cancelation process of a $(Q-1)^{th}$-order signal processing unit for the signal sensor data using the reference sensor data of the $Q^{th}$ group or signal-processed reference sensor data after noise cancelation processes of one or more of first- to $(Q-1)^{th}$-order signal processing units for the reference sensor data of the $Q^{th}$ group.

Here, the first-order signal processing unit will be described.

As an example, the first-order signal processing unit performs the noise cancelation process for the signal sensor data that is the data of the measurement signal measured by the signal sensor using the reference sensor data of the first group.

As another example, the first-order signal processing unit performs a noise cancelation process for the signal sensor data that is the data of the measurement signal measured by the signal sensor and the reference sensor data of one or more groups other than the first group using the reference sensor data of the first group.

That is, the first-order signal processing unit performs a noise cancelation process for at least the signal sensor data among the signal sensor data that is the data of the measurement signal measured by the signal sensor and the reference sensor data of one or more groups other than the first group using the reference sensor data of the first group.

Moreover, the $u^{th}$-order signal processing unit when u is an integer of 2 or more and (Q−1) or less will be described.

As an example, the $u^{th}$-order signal processing unit performs the noise cancelation process for the $(u-1)^{th}$-order signal-processed data after the noise cancelation process of the $(u-1)^{th}$-order signal processing unit for the signal sensor data using the reference sensor data of the $u^{th}$ group or the signal-processed reference sensor data after the noise cancelation processes of one or more of the first- to $(u-1)^{th}$-order signal processing units for the reference sensor data of the $u^{th}$ group.

As another example, the $u^{th}$-order signal processing unit performs the noise cancelation process for the $(u-1)^{th}$-order signal-processed data after the noise cancelation process of the $(u-1)^{th}$-order signal processing unit for the signal sensor data and the reference sensor data of one or more groups other than the first to $u^{th}$ groups or the signal-processed reference sensor data after the noise cancelation processes of one or more of the first- to $(u-1)^{th}$-order signal processing units for the reference sensor data of the one or more groups other than the first to $u^{th}$ groups using the reference sensor data of the $u^{th}$ group or the signal-processed reference sensor data after the noise cancelation processes of one or more of the first- to $(u-1)^{th}$-order signal processing units for the reference sensor data of the $u^{th}$ group.

That is, the $u^{th}$-order signal processing unit uses the reference sensor data of the $u^{th}$ group as an example and uses the signal-processed reference sensor data after the noise cancelation processes of one or more of the first- to $(u-1)^{th}$-order signal processing units for the reference sensor data of the $u^{th}$ group as another example.

Moreover, the $u^{th}$-order signal processing unit performs a noise cancelation process for at least the signal sensor data among the $(u-1)^{th}$-order signal-processed data after the noise cancelation process of the $(u-1)^{th}$-order signal processing unit for the signal sensor data and predetermined data related to the one or more groups other than the first to $u^{th}$ groups. Here, the predetermined data may be the reference sensor data of the one or more groups other than the first to $u^{th}$ groups as an example, the predetermined data may be the signal-processed reference sensor data after the noise cancelation processes of one or more of the first- to $(u-1)^{th}$-order signal processing units for the reference sensor data of one or more groups other than the first to $u^{th}$ groups as another example, and the predetermined data may be a combination of these data items for two or more groups (a combination of reference sensor data related to one or more groups and signal-processed reference sensor data related to one or more other groups) as yet another example.

The $Q^{th}$-order signal processing unit will be described.

The $Q^{th}$-order signal processing unit uses the reference sensor data of the $Q^{th}$ group as an example and uses the signal-processed reference sensor data after the noise cancelation processes of the one or more of the first- to $(Q-1)^{th}$-order signal processing units for the reference sensor data of the $Q^{th}$ group as another example.

Also, the $Q^{th}$-order signal processing unit performs the noise cancelation process for the $(Q-1)^{th}$-order signal-processed data after the noise cancelation process of the $(Q-1)^{th}$-order signal processing unit for the signal sensor data.

Thus, the first-order signal processing unit performs the noise cancelation process for the signal sensor data using the reference sensor data of the first group. Moreover, the first-order signal processing unit may perform the noise cancelation process for the reference sensor data of one or more groups of the second to $Q^{th}$ groups using the reference sensor data of the first group.

The $u^{th}$-order signal processing unit (each of the second- to $(Q-1)^{th}$-order signal processing units) performs a noise cancelation process for the measurement-related data from the signal processing unit of a previous order (i.e., an immediately previous order) using reference-sensor-related data of the $u^{th}$ group. The measurement-related data is data obtained by sequentially performing noise cancelation processes until the signal processing unit reaches the signal processing unit of the previous order (i.e., the immediately previous order) ($(u-1)^{th}$-order signal-processed data after the noise cancelation process). The reference-sensor-related data is data for which any noise cancelation process has not performed until the signal processing unit reaches the signal processing unit of the previous order (i.e., the immediately previous order) (reference sensor data) or data obtained by one or more noise cancelation processes until the signal processing unit reaches the signal processing unit of the previous order (i.e., the immediately previous order) (signal-processed reference sensor data).

Moreover, the $u^{th}$-order signal processing unit (each of the second- to $(Q-1)^{th}$-order signal processing units) may perform the noise cancelation process for the reference-sensor-related data of one or more groups among $(u+1)^{th}$ to $Q^{th}$ groups using the reference-sensor-related data of the $u^{th}$ group.

The $Q^{th}$-order signal processing unit performs a noise cancelation process for the measurement-related data from the $(Q-1)^{th}$-order signal processing unit using the reference-sensor-related data of the $Q^{th}$ group.

Configuration Example 2

The measurement device according to (configuration example 1), wherein Q is 2, wherein the first-order signal processing unit performs a noise cancelation process for the signal sensor data using the reference sensor data of the first group, and wherein the second-order signal processing unit performs a noise cancelation process for first-order signal-processed data after the noise cancelation process of the first-order signal processing unit for the signal sensor data using the reference sensor data of a second group other than the first group.

Configuration Example 3

The measurement device according to (configuration example 1), wherein Q is 2, wherein the first-order signal processing unit performs a noise cancelation process for both the signal sensor data and the reference sensor data of a second group other than a first group using the reference sensor data of the first group, and wherein the second-order signal processing unit performs a noise cancelation process for first-order signal-processed data after the noise cancelation process of the first-order signal processing unit for the signal sensor data using signal-processed reference sensor data after the noise cancelation process of the first-order signal processing unit for the reference sensor data of the second group.

Configuration Example 4

The measurement device according to any one of (configuration examples 1 to 3), wherein the reference sensor unit includes two or more types of sensors among types of sensors identical to a type of the signal sensor and types of sensors different from a type of the signal sensor as the reference sensor.

Configuration Example 5

The measurement device according to any one of (configuration examples 1 to 4), wherein, when K is an integer of 1 or more and Q or less, a $K^{th}$-order signal processing unit uses adaptive noise canceling (ANC) as a method of a noise cancelation process.

Configuration Example 6

The measurement device according to (configuration example 5), wherein, when U is 1 or more and Q or less and is an integer other than K, a $U^{th}$-order signal processing unit uses frequency-division ANC as a method of a noise cancelation process.

Configuration Example 7

The measurement device according to any one of (configuration examples 1 to 6), wherein the signal sensor unit includes a magnetic sensor as the signal sensor.

DESCRIPTION OF REFERENCES

1 Measurement device
11 Signal sensor arrangement unit
21 Information processing device
31 Measurement target
111 Input unit
112 Output unit
113 Storage unit
114 Control unit
131 Acquisition unit
141 Display unit
151, 151*a*, 151*b*, 151*c*, 151*d* Processing unit
152 Display control unit
161, 161*a*, 161*c* Reference sensor data grouping unit
171 Segmentation unit
172 Frequency domain division unit
173 Coefficient calculation unit
211 Signal data
311 Sensor unit
331 Signal sensor unit
332 Reference sensor unit
1011, 1031 Characteristic
A1 to AL Signal sensor
B1 to BM Reference sensor
P (P1 to PQ) Signal processing unit
P1, P1*a*, P1*b*, P1*c*, P1*d* First-order signal processing unit
P2, P2*a*, P2*b*, P2*c*, P2*d* Second-order signal processing unit
P3*c*, P3*d* Third-order signal processing unit
PQ $Q^{th}$-order signal processing unit

What is claimed is:

1. A measurement device comprising:

a signal sensor unit having one or more signal sensors configured to measure a measurement signal in which a target signal and noise are mixed;

a reference sensor unit having Q or more reference sensors configured to measure a reference signal including the noise when Q is an integer of 2 or more; and a processing unit, wherein the processing unit includes a reference sensor data grouping unit configured to classify reference sensor data that is data of Q or more reference signals measured by the Q or more reference sensors of the reference sensor unit into first to $Q^{th}$ groups that is Q groups; and a $k^{th}$-order signal processing unit, where k is an integer of 1 or more and Q or less, wherein a first-order signal processing unit performs a noise cancelation process for signal sensor data that is data of the measurement signal measured by the signal sensor using the reference sensor data of the first group or performs a noise cancelation process for the signal sensor data that is the data of the measurement signal measured by the signal sensor and the reference sensor data of one or more groups other than the first group using the reference sensor data of the first group, wherein, when u is an integer of 2 or more and (Q−1) or less, a $u^{th}$-order signal processing unit performs a noise cancelation process for $(u-1)^{th}$-order signal-processed data after a noise cancelation process of a $(u-1)^{th}$-order signal processing unit for the signal sensor data using the reference sensor data of a $u^{th}$ group or signal-processed reference sensor data after noise cancelation processes of one or more of first- to $(u-1)^{th}$-order signal processing units for the reference sensor data of the $u^{th}$ group or performs a noise cancelation process for $(u-1)^{th}$-order signal-processed data after the noise cancelation process of the $(u-1)^{th}$-order signal processing unit for the signal sensor data and the reference sensor data of one or more groups other than the first to $u^{th}$ groups or signal-processed reference sensor data after noise cancelation processes of one or more of the first- to $(u-1)^{th}$-order signal processing units for the reference sensor data using the reference sensor data of the $u^{th}$ group or signal-processed reference sensor data after noise cancelation processes of one or more of the first- to $(u-1)^{th}$-order signal processing units for the reference sensor data of the $u^{th}$ group, and wherein a $Q^{th}$-order signal processing unit performs a noise cancelation process for $(Q-1)^{th}$-order signal-processed data after a noise cancelation process of a $(Q-1)^{th}$-order signal processing unit for the signal sensor data using the reference sensor data of the $Q^{th}$ group or signal-processed reference sensor data after noise cancelation processes of one or more of first- to $(Q-1)^{th}$-order signal processing units for the reference sensor data of the $Q^{th}$ group.

2. The measurement device according to claim 1, wherein Q is 2, wherein the first-order signal processing unit performs a noise cancelation process for the signal sensor data using the reference sensor data of the first group, and wherein the second-order signal processing unit performs a noise cancelation process for first-order signal-processed data after the noise cancelation process of the first-order signal processing unit for the signal sensor data using the reference sensor data of a second group other than the first group.

3. The measurement device according to claim 1, wherein Q is 2, wherein the first-order signal processing unit performs a noise cancelation process for both the signal sensor data and the reference sensor data of a second group other than a first group using the reference sensor data of the first group, and wherein the second-order signal processing unit performs a noise cancelation process for first-order signal-processed data after the noise cancelation process of the first-order signal processing unit for the signal sensor data using signal-processed reference sensor data after the noise cancelation process of the first-order signal processing unit for the reference sensor data of the second group.

4. The measurement device according to claim 1, wherein the reference sensor unit includes two or more types of sensors among types of sensors identical to a type of the signal sensor and types of sensors different from a type of the signal sensor as the reference sensor.

5. The measurement device according to claim 1, wherein, when K is an integer of 1 or more and Q or less, a $K^{th}$-order signal processing unit uses adaptive noise canceling (ANC) as a method of a noise cancelation process.

6. The measurement device according to claim 5, wherein, when U is 1 or more and Q or less and is an integer other than K, a $U^{th}$-order signal processing unit uses frequency-division ANC as a method of a noise cancelation process.

7. The measurement device according to claim 1, wherein the signal sensor unit includes a magnetic sensor as the signal sensor.

* * * * *